United States Patent
Mori et al.

(10) Patent No.: US 9,148,967 B2
(45) Date of Patent: Sep. 29, 2015

(54) ELECTRONIC DEVICE

(71) Applicant: Panasonic Corporation, Kadoma-shi, Osaka (JP)

(72) Inventors: Takeshi Mori, Osaka (JP); Akira Iwamoto, Osaka (JP); Hitoshi Nakatani, Osaka (JP); Shun Shimazaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 209 days.

(21) Appl. No.: 13/765,457

(22) Filed: Feb. 12, 2013

(65) Prior Publication Data
US 2014/0055923 A1 Feb. 27, 2014

(30) Foreign Application Priority Data
Aug. 24, 2012 (JP) .................................. 2012-185585

(51) Int. Cl.
  *H05K 5/02* (2006.01)
  *H05K 5/00* (2006.01)
  *G06F 1/16* (2006.01)

(52) U.S. Cl.
  CPC .............. *H05K 5/0226* (2013.01); *G06F 1/162* (2013.01); *G06F 1/1616* (2013.01); *G06F 1/1637* (2013.01); *G06F 1/1681* (2013.01); *H05K 5/0017* (2013.01)

(58) Field of Classification Search
  None
  See application file for complete search history.

(56) References Cited

U.S. PATENT DOCUMENTS

| | | | |
|---|---|---|---|
| 6,512,670 B1 * | 1/2003 | Boehme et al. | 361/679.29 |
| 6,530,784 B1 * | 3/2003 | Yim et al. | 439/31 |
| 6,989,985 B2 * | 1/2006 | Tanimoto et al. | 361/679.06 |
| 7,129,931 B2 * | 10/2006 | Pappas | 345/168 |
| 7,375,956 B2 * | 5/2008 | Chuang et al. | 361/679.55 |
| 7,576,982 B2 * | 8/2009 | Wang et al. | 361/679.27 |
| 7,685,681 B2 * | 3/2010 | Nakajima et al. | 16/367 |
| 7,800,893 B2 * | 9/2010 | Tracy et al. | 361/679.27 |
| 8,621,716 B2 * | 1/2014 | Chen | 16/325 |
| 9,001,508 B2 * | 4/2015 | Mori et al. | 361/679.55 |
| 2003/0090862 A1 * | 5/2003 | Hsiang | 361/681 |
| 2004/0105227 A1 | 6/2004 | Tanimoto et al. | |
| 2011/0085297 A1 * | 4/2011 | Wright-Johnson et al. | 361/679.55 |
| 2011/0127184 A1 * | 6/2011 | Kawada et al. | 206/320 |
| 2014/0055922 A1 * | 2/2014 | MORI et al. | 361/679.01 |

FOREIGN PATENT DOCUMENTS

JP 2004-094647 3/2004

* cited by examiner

*Primary Examiner* — Adrian S Wilson
*Assistant Examiner* — Izak Baranowski
(74) *Attorney, Agent, or Firm* — Hamre, Schumann, Mueller & Larson, P.C.

(57) ABSTRACT

An electronic device 100 includes: a first casing 101; a second casing 102; a hinge mechanism 120 having an opening and closing axial-component 126 and an inverting axial-component 128; and a support assisting section 150. The support assisting section 150 includes: an axial-component 141 on an extended line of the opening and closing axial-component 126 in a normally opened position; and an axial-component receiving section 151 that supports the axial-component 141 on a wall surface of a recess 156 in the normally opened position. The recess 156 is open on at least one of a front side and a rear side in the axial-component receiving section 151. The second casing 102 is rotated about the inverting axial-component 128, and the axial-component 141 is moved into or out of the recess 156 through the side on which the recess 156 is open.

12 Claims, 7 Drawing Sheets

Fig. 4
(a)
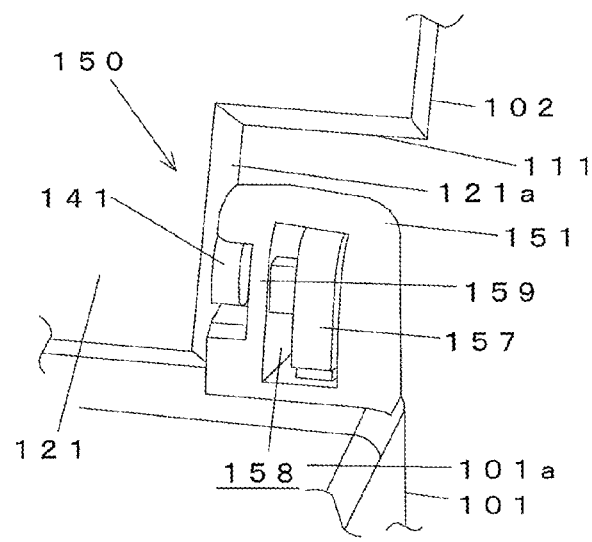
(b)
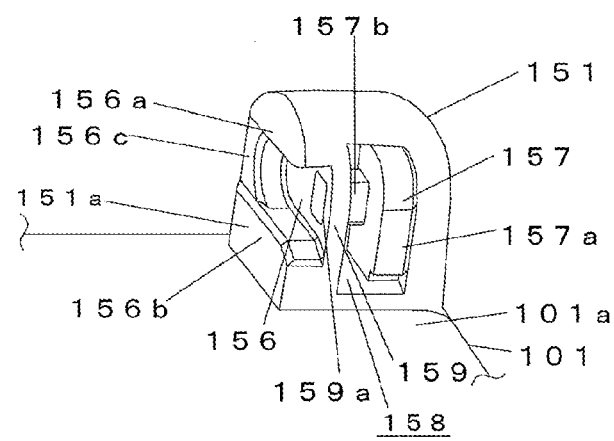
(c)
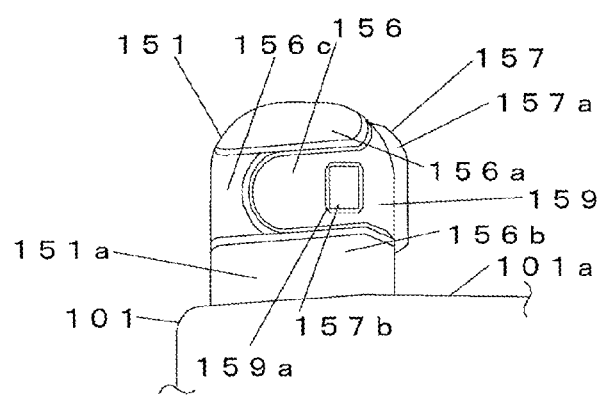

ABUTTING POSITION AGAINST DISPLAY

ELECTRONIC DEVICE

BACKGROUND

1. Field

The present disclosure relates to an electronic device that has a first casing and a second casing having a display, and that is openable and closable.

2. Description of the Related Art

Japanese Laid-Open Patent Publication No. 2004-094647 discloses an electronic device that includes a main unit, a display unit, and a hinge mechanism having a first shaft for connecting the display unit to the main unit so as to be openable and closable, and a second shaft for connecting the display unit to the main unit so as to rotate the display unit horizontally relative to the main unit. Hollow leg sections of the display unit each have an engagement component accommodated therein. The engagement component has a shaft-like shape that has a regular octagonal cross-section. The engagement component is supported by a housing of the display unit. The display unit includes a pair of operation levers. The operation levers are each used for moving the engagement component to an engagement position or a disengagement position, according to an operator's manual operation. At the engagement position, the engagement component is moved into a recess of a brake shaft, and engages with an inner surface of the recess. The brake shaft is supported, by a bracket fixed to a casing of the main unit, so as to be rotatable. When the display unit is rotated from a closed position to an open position, the rotation of the display unit is conveyed to the brake shaft through the engagement component, and a torque for the rotation is divided so as to be applied to both the hinge mechanism and the brake shaft.

SUMMARY

The present disclosure is to make available an electronic device effective in simplifying a structure of a support assisting section for assisting a hinge mechanism in supporting a casing having a display provided thereon.

An electronic device of the present disclosure includes a first casing; a second casing having a display; a hinge mechanism having: an opening and closing axial-component that is used when the electronic device is opened and closed by the opening and closing axial-component pivoting about a rear side portion of the first casing; and an inverting axial-component used when the second casing is rotated relative to the first casing with the electronic device being opened, to switch between a normally opened position in which the display faces the first casing side and an inversely opened position in which the display faces a side opposite to the side which the display faces in the normally opened position; and a support assisting section configured to assist the hinge mechanism in supporting the second casing. The support assisting section includes: an axial-component that is provided in one of the first casing and the second casing, and is positioned on an extended line of the opening and closing axial-component in the normally opened position; and an axial-component receiving section that is provided in the other of the first casing and the second casing, has formed therein a recess into which the axial-component fits in the normally opened position, and supports the axial-component on a wall surface of the recess. The recess is open on at least one of a front side and a rear side in the axial-component receiving section. The second casing is rotated about the inverting axial-component relative to the first casing, and the axial-component is moved into or out of the recess through the side on which the recess is open.

The electronic device of the present disclosure is effective in simplifying a structure of a support assisting section for assisting a hinge mechanism in supporting a casing having a display provided thereon.

BRIEF DESCRIPTION OF THE DRAWINGS

FIG. 4 illustrates a first support component of the electronic device according to the first embodiment;

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of patent claims.

First Embodiment

Hereinafter, a first embodiment will be described with reference to FIGS. 1 to 8.

[1-1. Entire Configuration of Electronic Device]

Figure 1:
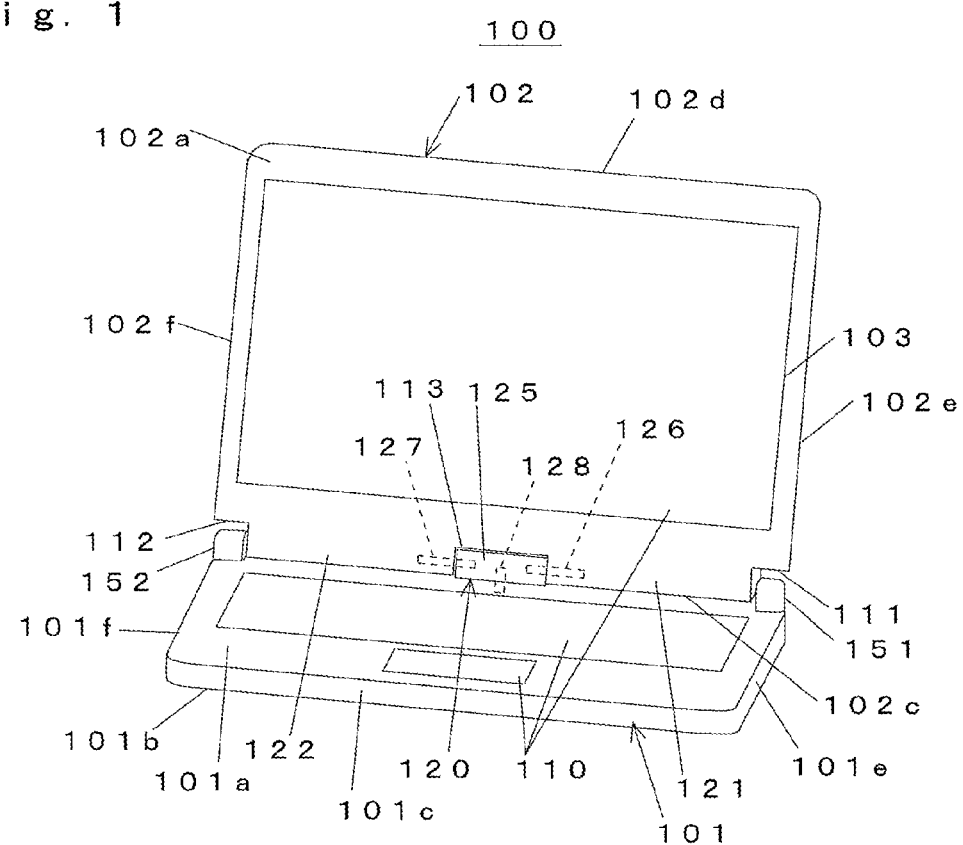
FIG. 1 is a perspective view illustrating a normally opened position of an electronic device according to a first embodiment.
Figure 2:
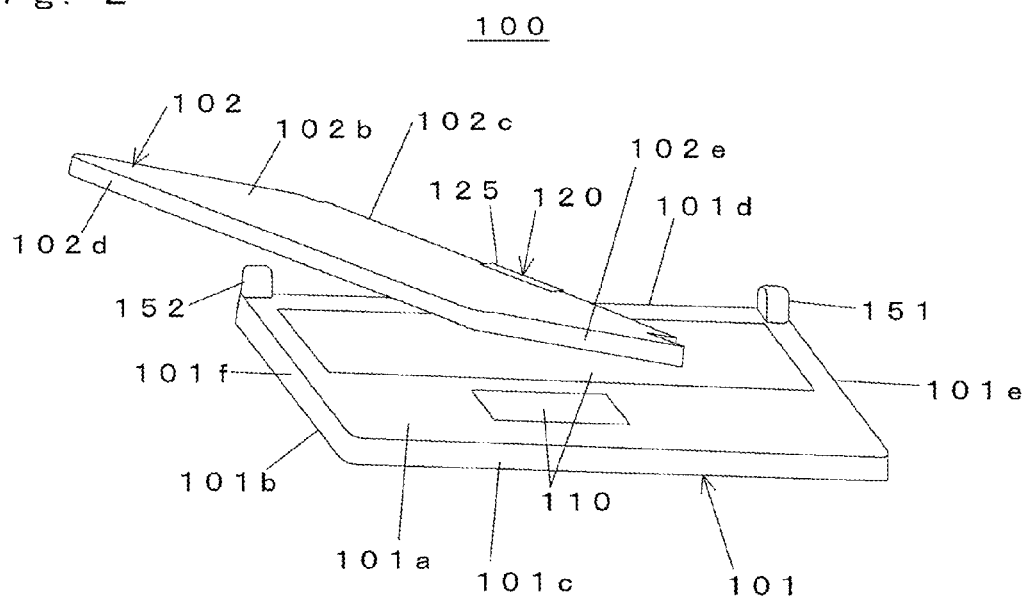
FIG. 2 is a perspective view illustrating a state where a second casing is tilted in the course of switching between the normally opened position and an inversely opened position, in the electronic device according to the first embodiment.

FIG. 1 is a perspective view illustrating a normally opened position of an electronic device 100 according to the present embodiment. FIG. 2 is a perspective view illustrating a state where a second casing 102 is tilted in the course of switching between the normally opened position and an inversely opened position, in the electronic device 100 according to the present embodiment.

As shown in FIG. 1, the electronic device 100 of the present embodiment is a notebook computer which is one example of an information processing apparatus. The electronic device 100 includes a first casing 101 having an operation section 110 provided on a top surface 101a, the second casing 102 having a display 103 provided on a front surface 102a, and a hinge mechanism 120 connecting a rear side portion of the first casing 101 to a lower side portion of the second casing 102. The operation section 110 is structured so as to receive an operation from a user of the electronic device 100, and is implemented as, for example, a keyboard, a touch pad, and a touch panel. The touch panel is disposed so as to overlap the display 103.

In the following description, the hinge mechanism 120 side of the first casing 101 is referred to as "far side" or "rear side", and a side opposite thereto is referred to as "near side" or "front side". Further, a surface that extends in the front-rear direction, among the outer circumferential surfaces (the surfaces of the first casing 101 which extend in the thickness direction) of the first casing 101, is referred to as "side surface".

As shown in FIG. 1 and FIG. 2, the first casing 101 is a thin casing having a roughly rectangular shape as viewed in a planar manner. The first casing 101 has the top surface 101a, a back surface 101b, a front side end face 101c, a rear side end face 101d, a first side surface 101e, and a second side surface 101f. The first casing 101 has a CPU, a memory (for example, an HDD), a battery, and the like mounted therein (not shown). The keyboard and the touch pad of the operation section 110 as described above are provided on the top surface 101a of the first casing 101. For example, a portion through which the battery is removed is provided on the back surface 101b of the first casing 101 (not shown). A connection terminal for an electrical cord, a connection port (for example, a USB port) for a peripheral device, and the like are provided on the rear side end face 101d of the first casing 101 (not shown).

As shown in FIG. 1 and FIG. 2, the second casing 102 is a thin casing having a roughly rectangular shape as viewed in a planar manner. The second casing 102 has the front surface 102a, a back surface 102b, a base end face 102c, a top end face 102d, a first side surface 102e, and a second side surface 102f. The shape and size of the second casing 102 are almost the same as the shape and size of the first casing 101, as viewed in the planar manner. In the second casing 102, the display 103 occupies a large part of the front surface 102a. The display 103 of the second casing 102 is opposed to the keyboard of the first casing 101 in a closed state in which the first casing 101 and the second casing 102 are overlaid with each other. Hereinafter, the closed state where the first casing 101 is overlaid with the entirety of the second casing 102, and the display 103 is opposed to the keyboard, is referred to as a normally closed position. In the second casing 102, the back surface 102b opposite to the display 103 is a shield surface for protecting the electronic device 100.

The second casing 102 has a first cut portion 111, a second cut portion 112, and a third cut portion 113 formed on a base end side (a lower side in FIG. 1) on which the hinge mechanism 120 is connected. The first cut portion 111 is formed at one end (the right hand edge in FIG. 1), on the base end side, of the second casing 102. The second cut portion 112 is formed at the other end (the left hand edge in FIG. 1), on the base end side, of the second casing 102. The third cut portion 113 is formed at almost the center portion, on the base end side, of the second casing 102.

Further, on the base end side of the second casing 102, a first projecting case component 121 is provided between the first cut portion 111 and the third cut portion 113, and a second projecting case component 122 is provided between the second cut portion 112 and the third cut portion 113. The first projecting case component 121 and the second projecting case component 122 are each a case component that projects on the base end side of the second casing 102, and that has a roughly rectangular parallelepiped shape. The first projecting case component 121 and the second projecting case component 122 form a part of the second casing 102.

The hinge mechanism 120 is formed as a so-called two-axis hinge. The hinge mechanism 120 connects between the rear side portion of the first casing 101 and the base end side portion of the second casing 102 such that the electronic device 100 is openable and closable, and the second casing 102 is rotatable relative to the first casing 101 in a state where the electronic device 100 is opened, so as to switch between the normally opened position where the display 103 faces the first casing 101 side, and the inversely opened position where the display 103 faces a side opposite to the side which the display 103 faces in the normally opened position.

Specifically, the hinge mechanism 120 includes: a housing 125 that is disposed in the third cut portion 113 and has a roughly rectangular parallelepiped shape; opening and closing axial-components 126 and 127 for opening and closing the electronic device 100; and an inverting axial-component 128 for inverting the second casing 102, as shown in FIG. 1. The opening and closing axial-components 126 and 127 are formed as two axial-components. The two opening and closing axial-components, 126 and 127, are provided so as to be parallel to the base end face 102c of the second casing 102 and coaxial with each other. One of the opening and closing axial-components, 126 and 127, that is, the opening and closing axial-component 126 in the present embodiment, has one end portion supported by an axial-component receiving section (not shown) in the housing 125 so as to be rotatable, and has the other end portion supported by an axial-component receiving section (not shown) in the first projecting case component 121 so as to be rotatable. The other of the opening and closing axial-components, 126 and 127, that is, the opening and closing axial-component 127 in the present embodiment, has one end portion supported by an axial-component receiving section (not shown) in the housing 125 so as to be rotatable, and has the other end portion supported by an axial-component receiving section (not shown) in the second projecting case component 122 so as to be rotatable. The inverting axial-component 128 extends in the thickness direction of the first casing 101. The inverting axial-component 128 has one end portion supported by an axial-component receiving section (not shown) in the housing 125, so as to be rotatable, and the other end portion supported by an axial-component receiving section (not shown) in the first casing 101, so as to be rotatable.

The electronic device 100 switches from the normally closed position to the normally opened position where a user is allowed to view the display 103, by the second casing 102 pivoting about the opening and closing axial-components 126 and 127 and opening so as to move away from the front side portion of the first casing 101. In the normally opened position, the display 103 faces the first casing 101 side. The electronic device 100 switches from the normally opened position to the inversely opened position where the display 103 faces a side opposite to the first casing 101 side, by the second casing 102 pivoting about the inverting axial-component 128 so as to rotate relative to the first casing 101. The electronic device 100 switches from the inversely opened position to the inversely closed position where the electronic device 100 is closed with the display 103 facing the side opposite to the first casing 101 side, by the second casing 102 pivoting about the opening and closing axial-components 126 and 127 and closing so as to approach the front side portion of the first casing 101. When the second casing 102 is moved in a direction opposite to the direction in which the normally closed position is changed to the inversely closed position, the electronic device 100 is returned from the inversely closed position to the normally closed position through the inversely opened position and the normally opened position.

Figure 3:
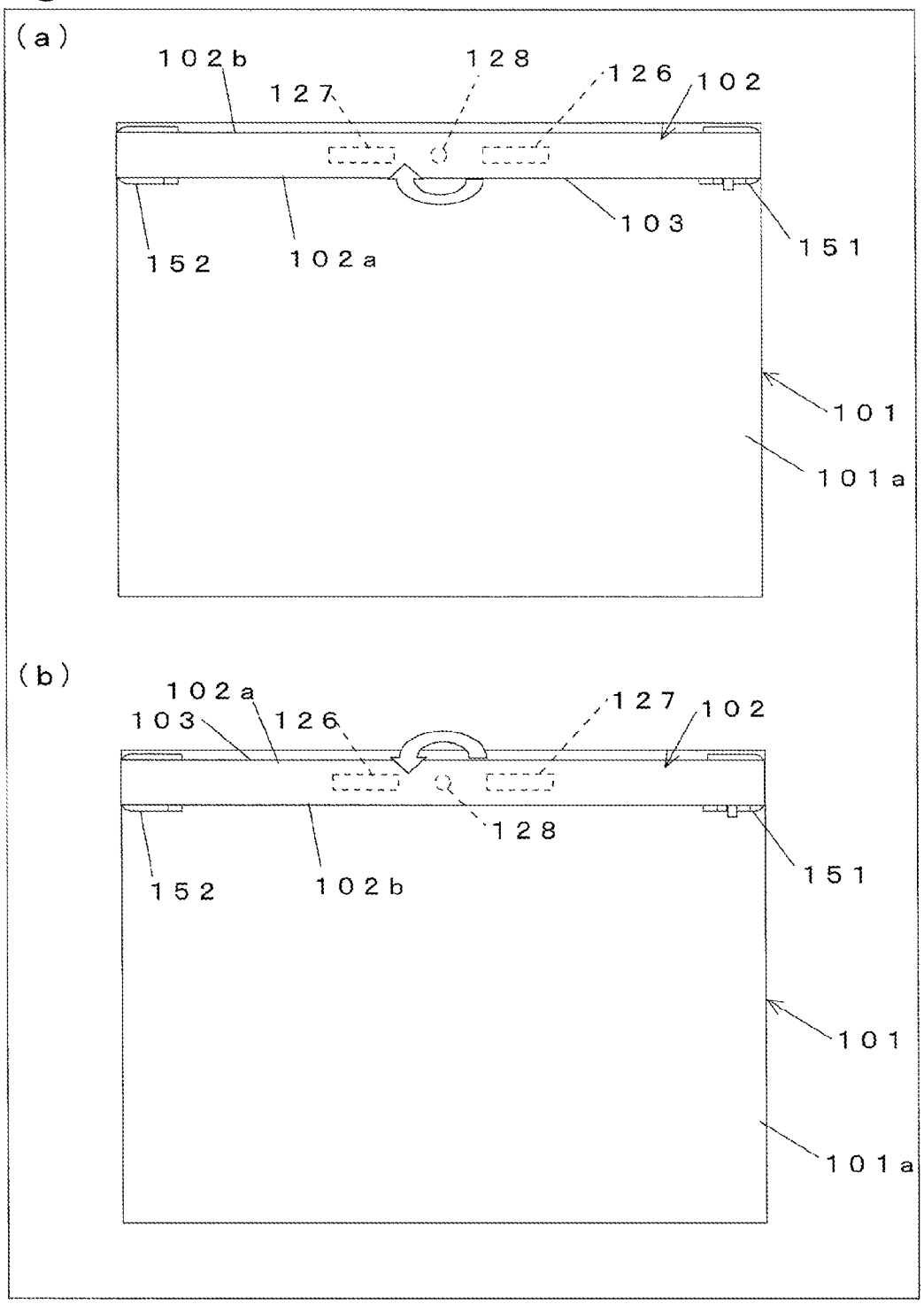
FIG. 3 is a schematic diagram illustrating a range in which the second casing is allowed to rotate about an inverting axial-component in the first embodiment.

The hinge mechanism 120 is structured such that a range of directions in which the display 103 is allowed to face when switching between the normally opened position and the inversely opened position is being performed, is limited to almost half a range of the entire circumference around the inverting axial-component 128. FIG. 3 is a schematic diagram illustrating a range in which the second casing 102 is allowed to rotate about the inverting axial-component 128. Specifically, the hinge mechanism 120 is structured such that, in the course of the normally opened position being switched to the inversely opened position, the second casing 102 is allowed to rotate relative to the first casing 101 only in a first rotation direction (the clockwise direction as viewed from above the electronic device 100) that causes the display 103 to face a second support component 152 described below, as shown in FIG. 3(a). Further, the hinge mechanism 120 is structured such that, in the course of the inversely opened position being switched to the normally opened position, the second casing 102 is allowed to rotate relative to the first casing 101 only in a second rotation direction (the counterclockwise direction as viewed from above the electronic device 100) opposite to the first rotation direction, as shown in FIG. 3(b). The first rotation direction and the second rotation direction are each a direction of rotation about the inverting axial-component 128.

Further, as shown in FIG. 2, the hinge mechanism 120 is structured such that, also in the course of the switching between the normally opened position and the inversely opened position, the second casing 102 is allowed to rotate relative to the first casing 101 by pivoting about the opening and closing axial-components 126 and 127.

[1-2. Structure of Support Assisting Section]

The electronic device 100 further includes a support assisting section 150 for assisting the hinge mechanism 120 in supporting the second casing 102. The support assisting section 150 includes a first auxiliary axial-component 141, a second auxiliary axial-component 142, a first support component 151, and the second support component 152.

Figure 5:
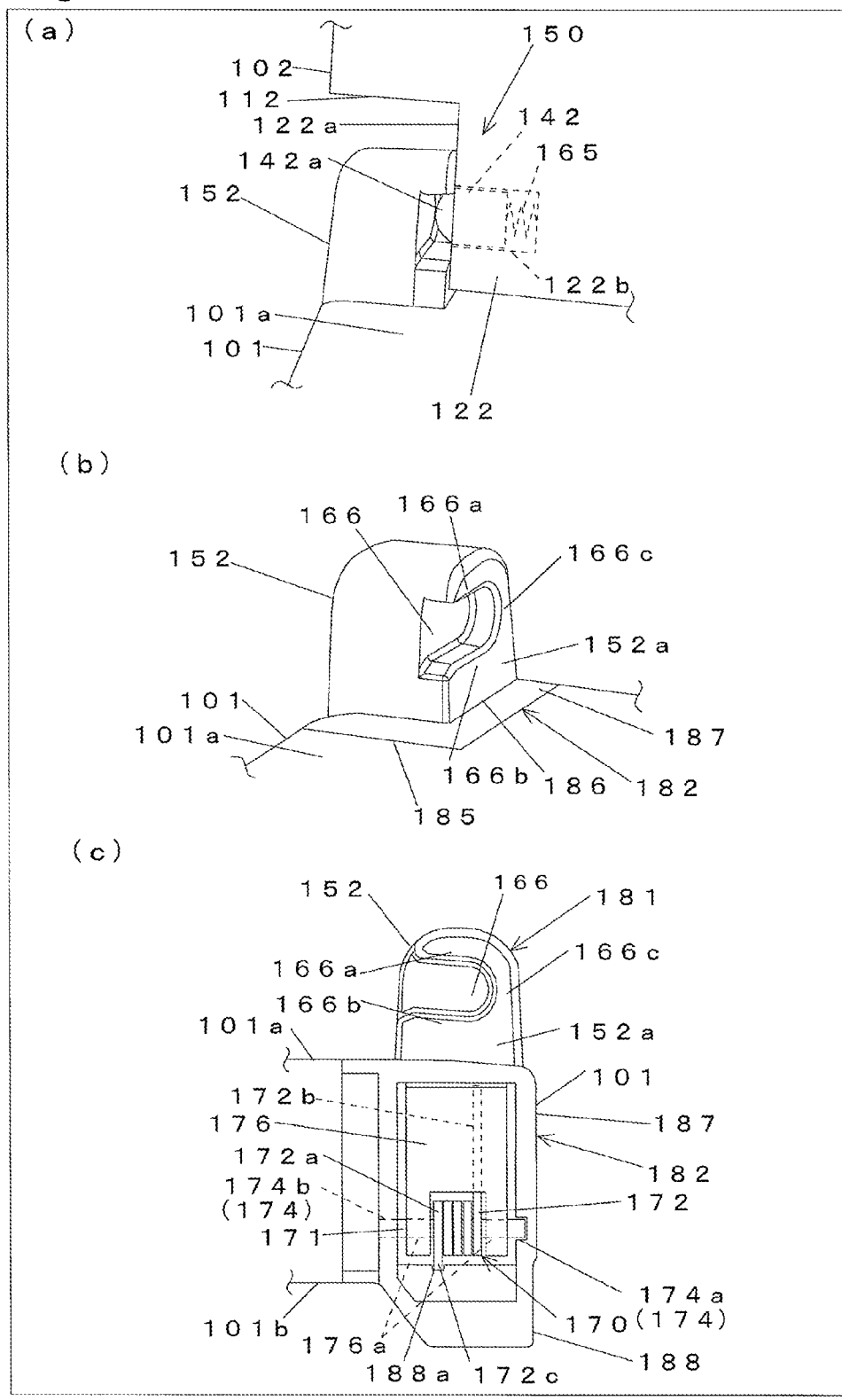
FIG. 5 illustrates a second support component of the electronic device according to the first embodiment.

FIG. 4 illustrates the first support component 151 of the electronic device 100 according to the present embodiment. FIG. 4(a) is a perspective view of the first support component 151 having the first auxiliary axial-component 141 fitted therein, FIG. 4(b) is a perspective view of the first support component 151 which does not have the first auxiliary axial-component 141 fitted therein, and FIG. 4(c) is a front view of an inner surface 151a of the first support component 151. FIG. 5 illustrates the second support component 152 of the electronic device 100 according to the present embodiment. FIG. 5(a) is a perspective view of the second support component 152 having the second auxiliary axial-component 142 fitted therein, FIG. 5(b) is a perspective view of the second support component 152 which does not have the second auxiliary axial-component 142 fitted therein, and FIG. 5(c) is a front view of an inner surface 152a of the second support component 152.

The first auxiliary axial-component 141 projects on an outer side surface 121a of the first projecting case component 121 as shown in FIG. 4(a). The first auxiliary axial-component 141 is formed as an axial-component having a flat top surface and having a roughly circular-cylindrical shape. Further, the second casing 102 having provided therein the first auxiliary axial-component 141 as the axial-component forms a casing having an axial-component. The first auxiliary axial-component 141 is disposed on an extended line of the axes of the opening and closing axial-components 126 and 127 as shown in FIG. 6(a) indicated below. The first auxiliary axial-component 141 is coaxial with the opening and closing axial-components 126 and 127. The first auxiliary axial-component 141 is fixed to the first projecting case component 121. Therefore, if the top surface of the first auxiliary axial-component 141 is pushed toward the inner side of the first projecting case component 121, the first auxiliary axial-component 141 does not move, and an amount of projection of the first auxiliary axial-component 141 is not changed.

The second auxiliary axial-component 142 projects on an outer side surface 122a of the second projecting case component 122 as shown in FIG. 5(a). The second auxiliary axial-component 142 has a roughly circular-cylindrical shape and a top portion 142a which is rounded. The top portion 142a is formed in a semispherical shape. The second auxiliary axial-component 142 is disposed on an extended line of the axes of the opening and closing axial-components 126 and 127 as shown in FIG. 6(a). The second auxiliary axial-component 142 is coaxial with the opening and closing axial-components 126 and 127. The support assisting section 150 further includes an elastic component (for example, a coil spring) 165 for urging the second auxiliary axial-component 142 as shown in FIG. 5(a). The elastic component 165 is a component for changing an amount of projection of the second auxiliary axial-component 142 from the outer side surface 122a of the second projecting case component 122.

For example, the second projecting case component 122 has formed therein a mounting hole 122b in which the second auxiliary axial-component 142 and the elastic component 165 are mounted. The mounting hole 122b is open on the outer side surface 122a. The elastic component 165 has one end connected to a bottom surface of the mounting hole 122b, and has the other end connected to a base end face of the second auxiliary axial-component 142. An edge portion around the mounting hole 122b projects slightly inward so as not to disengage the elastic component 165. Further, even when an amount of projection of the second auxiliary axial-component 142 from the outer side surface 122a is maximum, the elastic component 165 is contracted, and pushes the second auxiliary axial-component 142 outward. In this state, the second auxiliary axial-component 142 is caught by the edge portion around the mounting hole 122b, and the second auxiliary axial-component 142 is not disengaged from the mounting hole 122b. When the top portion 142a of the second auxiliary axial-component 142 is pushed toward an inner side of the second projecting case component 122, the contraction of the elastic component 165 is enhanced, to move the second auxiliary axial-component 142 inward (rightward in FIG. 5(a)). When a force for pushing the top portion 142a of the second auxiliary axial-component 142 is removed, the elastic component 165 is extended, to return the second auxiliary axial-component 142 to an original position. An amount of projection of the second auxiliary axial-component 142 is changed according to a force applied to the top portion 142*a* of the second auxiliary axial-component 142.

The first support component 151 is provided on one corner portion (the right far side corner portion in FIG. 1) on the far side of the top surface 101*a* of the first casing 101. The first support component 151 is a small projection having a rounded top portion as shown in FIG. 4. The first support component 151 projects from the top surface 101*a* of the first casing 101. The first support component 151 is fixed to the first casing 101. The first support component 151 corresponds to a first axial-component receiving section having a recess 156 into which the first auxiliary axial-component 141 fits in the normally opened position. The first support component 151 supports the first auxiliary axial-component 141 on a wall surface of the recess 156.

The first support component 151 has the recess 156 formed, in almost a U-shape, on an inner surface 151*a* that is opposed to the outer side surface 121*a* of the first projecting case component 121 in the normally opened position, as shown in FIG. 4(*c*). In the first support component 151, the recess 156 is open on the front side thereof. The recess 156 includes an upper axial-component support wall 156*a*, a lower axial-component support wall 156*b*, and a rear side axial-component stop wall 156*c*, as shown in FIG. 4(*b*). The upper axial-component support wall 156*a*, the lower axial-component support wall 156*b*, and the rear side axial-component stop wall 156*c* extend almost perpendicular to the bottom surface of the recess 156 through a haunch. In the first support component 151, the axial-component stop wall 156*c* prevents passing of the first auxiliary axial-component 141. The height (the height from the bottom surface of the recess 156 to the top end of the axial-component stop wall 156*c*) of the axial-component stop wall 156*c* is lower than the height of each of the axial-component support walls 156*a* and 156*b* paired, as shown in FIG. 4(*b*). The height of the upper axial-component support wall 156*a* and the height of the lower axial-component support wall 156*b* are the same. Further, the height of the axial-component stop wall 156*c* of the first support component 151 is lower than the height of an axial-component stop wall 166*c* of the second support component 152 as described below.

Further, the first support component 151 includes a stopper 157 used for holding the first auxiliary axial-component 141 in the recess 156. The stopper 157 includes an operation component 157*a* operated by a user, and a rod component 157*b* integrated with the operation component 157*a*, as shown in FIG. 4(*b*).

The operation component 157*a* has a plate-like shape having a rounded upper front side portion. The operation component 157*a* is provided in a mounting space 158 formed in the first support component 151. The mounting space 158 is adjacent to the recess 156 via a separation wall 159. The mounting space 158 has an opening at the front surface of the first support component 151. Through the opening, the operation component 157*a* slightly projects.

On the other hand, the rod component 157*b* has a rod-like shape having a roughly rectangular cross-section. The rod component 157*b* is inserted into a through hole 159*a* formed in the separation wall 159. The rod component 157*b* has one end connected to a surface, on the separation wall 159 side, of the operation component 157*a*.

When the stopper 157 is slid in the axial direction of the rod component 157*b* by a user, switching is performed between a projecting state in which the rod component 157*b* projects from the bottom surface of the recess 156 to prevent the first auxiliary axial-component 141 from passing through the open side portion of the recess 156, and a non-projecting state in which the rod component 157*b* does not project from the bottom surface of the recess 156. The through hole 159*a* formed in the separation wall 159 is positioned so as to accommodate the first auxiliary axial-component 141 between the rod component 157*b* and the axial-component stop wall 156*c* in the projecting state. Therefore, the non-projecting state can be switched to the projecting state in a state where the first auxiliary axial-component 141 abuts against the axial-component stop wall 156*c*. In the projecting state, the first auxiliary axial-component 141 is held in the recess 156 by the stopper 157. When the projecting state is switched to the non-projecting state, a state where the first auxiliary axial-component 141 is held in the recess 156 by the stopper 157 is cancelled, and the first auxiliary axial-component 141 is allowed to pass through the open side portion of the recess 156.

The second support component 152 is provided on the other corner portion (the left far side corner portion in FIG. 1) on the far side of the top surface 101*a* of the first casing 101. The second support component 152 is provided in the first casing 101 on the side opposite to the first support component 151 side so as to sandwich the hinge mechanism 120. The second support component 152 is a small projection having a rounded top portion as shown in FIG. 5. The second support component 152 projects from the top surface 101*a* of the first casing 101. The second support component 152 is formed as a second axial-component receiving section having formed therein a recess 166 into which the first auxiliary axial-component 141 fits in the inversely opened position. Further, the second support component 152 forms a part of a movable component 181 described below.

As shown in FIG. 5(*c*), the second support component 152 has the recess 166 formed, in almost a U-shape, on the inner surface 152*a* that is opposed to the outer side surface 122*a* of the second projecting case component 122 in the normally opened position. In the second support component 152, the recess 166 is open on the front side thereof. The recess 166 includes an upper axial-component support wall 166*a*, a lower axial-component support wall 166*b*, and a rear side axial-component stop wall 166*c*. The upper axial-component support wall 166*a*, the lower axial-component support wall 166*b*, and the rear side axial-component stop wall 166*c* extend almost perpendicular to the bottom surface of the recess 166 through a haunch. In the second support component 152, the axial-component stop wall 166*c* prevents passing of the first auxiliary axial-component 141. The height (the height from the bottom surface of the recess 166 to the top end of the axial-component stop wall 166*c*) of the axial-component stop wall 166*c* is the same as the height of each of the upper axial-component support wall 166*a* and the lower axial-component support wall 166*b* as shown in FIG. 5(*b*).

[1-3. Function, Effect, and the Like of Support Assisting Section]

A function, an effect, and the like of the support assisting section 150 in opening and closing the electronic device 100 will be described.

Firstly, an exemplary case where the support assisting section 150 is not included in the electronic device 100 is assumed and described for comparison with the present embodiment. The second casing 102 is supported by the first casing 101 via the hinge mechanism 120. The hinge mechanism 120 is connected to the center portion, on the base end side, of the second casing 102. Therefore, in a case where the electronic device 100 is in the normally opened position or the inversely opened position, unless the support assisting section 150 is provided, the second casing 102 is likely to pivot about the hinge mechanism 120 and tilt leftward or rightward.

If the second casing 102 tilts leftward or rightward, a relatively heavy load may be applied to the hinge mechanism 120.

On the other hand, in the present embodiment, the first auxiliary axial-component 141 having an amount of projection unchanged, the first support component 151 having formed therein the recess 156 into which the first auxiliary axial-component 141 fits in the normally opened position, and the second support component 152 having formed therein the recess 166 into which the first auxiliary axial-component 141 fits in the inversely opened position, are provided. In a state where the first auxiliary axial-component 141 fits into the recess 156 (or the recess 166), the first auxiliary axial-component 141 abuts against the upper axial-component support wall 156a (or the upper axial-component support wall 166a), and the first auxiliary axial-component 141 abuts against the lower axial-component support wall 156b (or the lower axial-component support wall 166b). A small gap may be formed between the first auxiliary axial-component 141 and the upper axial-component support wall 156a (or the upper axial-component support wall 166a), and a small gap may be formed between the first auxiliary axial-component 141 and the lower axial-component support wall 156b (or the lower axial-component support wall 166b).

Therefore, in the normally opened position, the lower axial-component support wall 156b of the first support component 151 abuts against the first auxiliary axial-component 141 to prevent the second casing 102 from pivoting about the hinge mechanism 120 and tilting rightward in FIG. 1, and the upper axial-component support wall 156a of the first support component 151 abuts against the first auxiliary axial-component 141 to prevent the second casing 102 from pivoting about the hinge mechanism 120 and tilting leftward in FIG. 1. The first auxiliary axial-component 141 is supported by the wall surfaces of the recess 156 of the first support component 151. "Tilting the second casing 102 leftward (or rightward)" represents "titling the second casing 102 so as to be lowered leftward (or rightward)".

On the other hand, in the inversely opened position, the upper axial-component support wall 166a of the second support component 152 abuts against the first auxiliary axial-component 141 to prevent the second casing 102 from pivoting about the hinge mechanism 120 and tilting rightward, and the lower axial-component support wall 166b of the second support component 152 abuts against the first auxiliary axial-component 141 to prevent the second casing 102 from pivoting about the hinge mechanism 120 and tilting leftward. The first auxiliary axial-component 141 is supported by the wall surfaces of the recess 166 of the second support component 152.

Further, in the present embodiment, the second auxiliary axial-component 142 is also provided. The second auxiliary axial-component 142 is formed as a projection component that fits into the recess 166 of the second support component 152 in the normally opened position, and fits into the recess 156 of the first support component 151 in the inversely opened position. Therefore, in the normally opened position, the upper axial-component support wall 166a and the lower axial-component support wall 166b of the second support component 152 abut against the second auxiliary axial-component 142 to prevent the second casing 102 from pivoting about the hinge mechanism 120 and tilting leftward and rightward. On the other hand, in the inversely opened position, the upper axial-component support wall 156a and the lower axial-component support wall 156b of the first support component 151 abut against the second auxiliary axial-component 142 to prevent the second casing 102 from pivoting about the hinge mechanism 120 and tilting leftward and rightward.

As described above, according to the present embodiment, the support assisting section 150 assists in supporting the second casing 102 when the electronic device 100 is opened and closed, and the second casing 102 can be supported at three sections, that is, the hinge mechanism 120, the first support component 151, and the second support component 152. Therefore, the second casing 102 can be restrained from tilting leftward and rightward when the electronic device 100 is opened and closed.

Further, when the stopper 157 is put into the projecting state in the normally opened position, the rotation of the second casing 102 about the inverting axial-component 128 can be inhibited. Therefore, the second casing 102 can be stably supported when the normally opened position is switched to the normally closed position.

Figure 6:
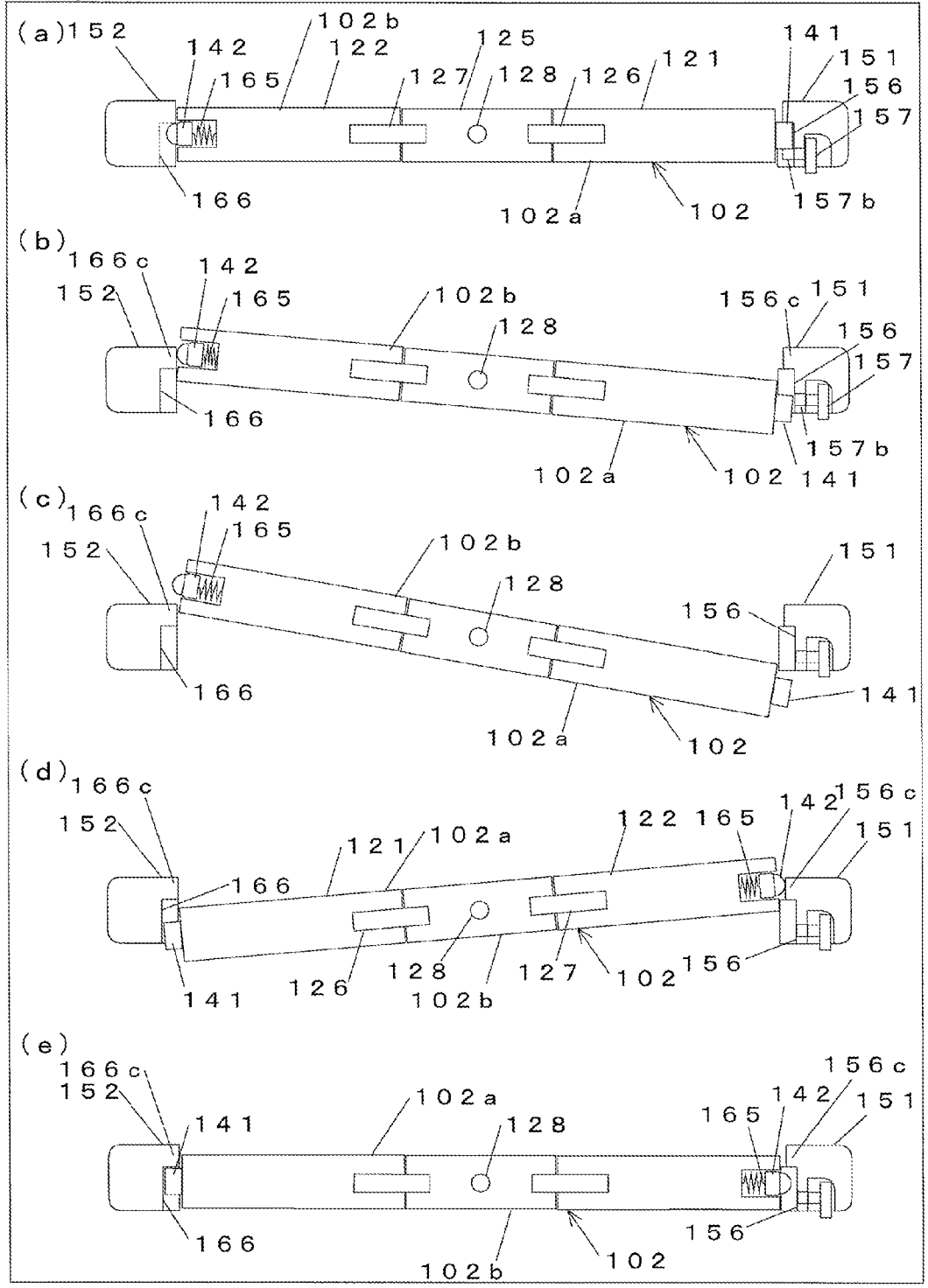
FIG. 6 is a cross-sectional view of a base end portion of the second casing, illustrating a function of a support assisting section exhibited when the second casing is rotated about the inverting axial-component in the electronic device according to the first embodiment.

Subsequently, the function, the effect, and the like of the support assisting section 150 in rotating the second casing 102 about the inverting axial-component 128 will be described. FIG. 6 is a cross-sectional view of the base end portion of the second casing 102, illustrating a function of the support assisting section 150 exhibited when the second casing 102 is rotated about the inverting axial-component 128. FIG. 6(a) is a cross-sectional view illustrating the normally opened position, FIG. 6(b) is a cross-sectional view illustrating a state where the second casing 102 is rotated clockwise by five degrees from the normally opened position, FIG. 6(c) is a cross-sectional view illustrating a state where the second casing 102 is rotated clockwise by ten degrees from the normally opened position, FIG. 6(d) is a cross-sectional view illustrating a state where the second casing 102 is rotated clockwise by 175 degrees from the normally opened position, and FIG. 6(e) is a cross-sectional view illustrating a state (that is, the inversely opened position) where the second casing 102 is rotated clockwise by 180 degrees from the normally opened position.

As shown in FIG. 6(a), the first auxiliary axial-component 141 fits into the recess 156 of the first support component 151, and the second auxiliary axial-component 142 fits into the recess 166 of the second support component 152, in the normally opened position. In FIG. 6(a), the stopper 157 is in the projecting state. If rotation of the second casing 102 about the inverting axial-component 128 is attempted, the first auxiliary axial-component 141 is caught by the rod component 157b of the stopper 157, and the second casing 102 cannot be rotated. When a user operates the stopper 157 so as to be put into the projecting state in the normally opened position, an unintended rotation of the second casing 102 can be prevented.

When the user switches the stopper 157 to the non-projecting state in the normally opened position, the second casing 102 is allowed to rotate. When the second casing 102 is rotated slightly from the normally opened position, the first auxiliary axial-component 141 passes through the open side portion of the recess 156 of the first support component 151 as shown in FIG. 6(b). On the other hand, the top portion 142a of the second auxiliary axial-component 142 abuts against and is pushed by the axial-component stop wall 166c of the second support component 152. As a result, the elastic component 165 is contracted, and an amount of projection of the second auxiliary axial-component 142 is reduced. Thus, the second auxiliary axial-component 142 is allowed to pass by the axial-component stop wall 166c. When the second auxiliary axial-component 142 has passed by the axial-component stop wall 166c, the elastic component 165 is extended and an amount of projection of the second auxiliary axial-component 142 is restored as shown in FIG. 6(c). Thus, the second auxiliary axial-component 142 is disengaged from the recess 166 of the second support component 152.

As shown in FIG. 6(d), since the recess 166 of the second support component 152 is open on the front side, the first auxiliary axial-component 141 passes through the open side portion of the recess 166 of the second support component 152, and fits into the recess 166. On the other hand, the top portion 142a of the second auxiliary axial-component 142 abuts against and is pushed by the axial-component stop wall 156c of the first support component 151 immediately before fitting into the recess 156 of the first support component 151. As a result, the elastic component 165 is contracted, and an amount of projection of the second auxiliary axial-component 142 is reduced. Thus, the second auxiliary axial-component 142 is allowed to pass by the axial-component stop wall 156c. When the second auxiliary axial-component 142 has passed by the axial-component stop wall 156c and fits into the recess 156, the elastic component 165 is extended, and an amount of projection of the second auxiliary axial-component 142 is restored as shown FIG. 6(e).

As described above, the second casing 102 can be rotated about the inverting axial-component 128 relative to the first casing 101, to move the first auxiliary axial-component 141 into or out of the recesses 156 and 166 through the open end portions of the recesses 156 and 166. Further, the second auxiliary axial-component 142 can be caused to pass by the axial-component stop walls 156c and 166c with an amount of projection of the second auxiliary axial-component 142 being changed, thereby enabling the second auxiliary axial-component 142 to move into or out of the recesses 156 and 166.

Further, since the first auxiliary axial-component 141 is fixed to the second casing 102, an amount of projection of the first auxiliary axial-component 141 is constant. Therefore, the first auxiliary axial-component 141 can be supported by the first support component 151 with enhanced stability in the normally opened position, and the first auxiliary axial-component 141 can be supported by the second support component 152 with enhanced stability in the inversely opened position.

Further, since an amount of projection of the second auxiliary axial-component 142 is changed by means of the elastic component 165, the second auxiliary axial-component 142 can be smoothly moved into or out of the recesses 156 and 166 regardless of the support components 151 and 152 having provided therein the axial-component stop walls 156c and 166c for preventing passing of the first auxiliary axial-component 141. In the present embodiment, since the top portion 142a of the second auxiliary axial-component 142, which is rounded, abuts against the axial-component stop walls 156c and 166c, the second auxiliary axial-component 142 can be smoothly moved into or out of the recesses 156 and 166. Further, in the first support component 151, since the height of the axial-component stop wall 156c is lower than the height of each of the axial-component support walls 156a and 156b, the second auxiliary axial-component 142 can be smoothly moved into or out of the recess 156.

Further, when the second auxiliary axial-component 142 fits into the recess 156 or 166, a user can feel that an amount of the projection of the second auxiliary axial-component 142 is restored, and the user can recognize that the switching between the normally opened position and the inversely opened position has been ended. In particular, the height of the axial-component stop wall 156c of the first support component 151 is lower than the height of the axial-component stop wall 166c of the second support component 152. Therefore, the user can experience a different feeling between the switching to the normally opened position and the switching to the inversely opened position.

Further, in the support components 151 and 152, among the front side portion and the rear side portion of each of the recesses 156 and 166, the portion through which the first auxiliary axial-component 141 passes when the second casing 102 is rotated in a direction in which the rotation is allowed, is opened, and the axial-component stop walls 156c and 166c are formed on the sides opposite to the open sides. Therefore, the second casing 102 can be prevented from rotating beyond a rotation range of the second casing 102 which is set for the hinge mechanism 120.

[1-4. Structure of Movable Support Section]

The electronic device 100 further includes a movable support section 170 for supporting the second support component 152 so as to be movable relative to the first casing 101 such that, when the second support component 152 is pushed by the display 103, an amount of projection of the second support component 152 from the top surface 101a of the first casing 101 is reduced, as shown in FIG. 5(c). The second support component 152 is positioned, on the top surface 101a of the first casing 101, at such a position as to abut against the display 103 in a case where the electronic device 100 is closed in the course of switching between the normally opened position and the inversely opened position. The second support component 152 supports not the opening and closing axial-components 126 and 127 of the hinge mechanism 120, but the first auxiliary axial-component 141 and the second auxiliary axial-component 142 as an axial-component for opening and closing the electronic device 100, as described above. The opening and closing axial-components 126 and 127 act as a main axial-component, and the first auxiliary axial-component 141 and the second auxiliary axial-component 142 act as an auxiliary axial-component.

Figure 7:
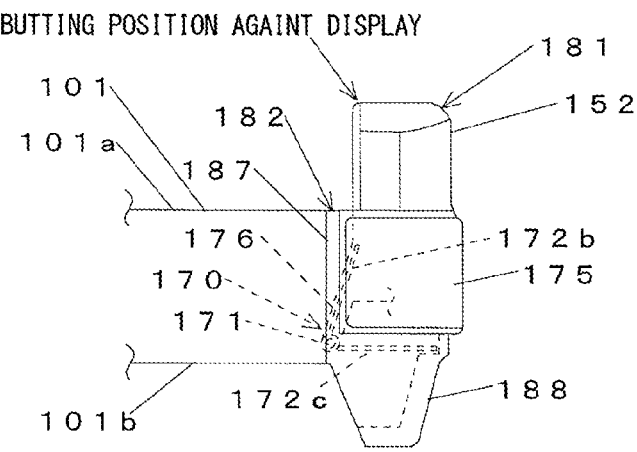
FIG. 7 illustrates the second support component of the electronic device according to the first embodiment, as viewed from a rear side of a first casing.
Figure 8:
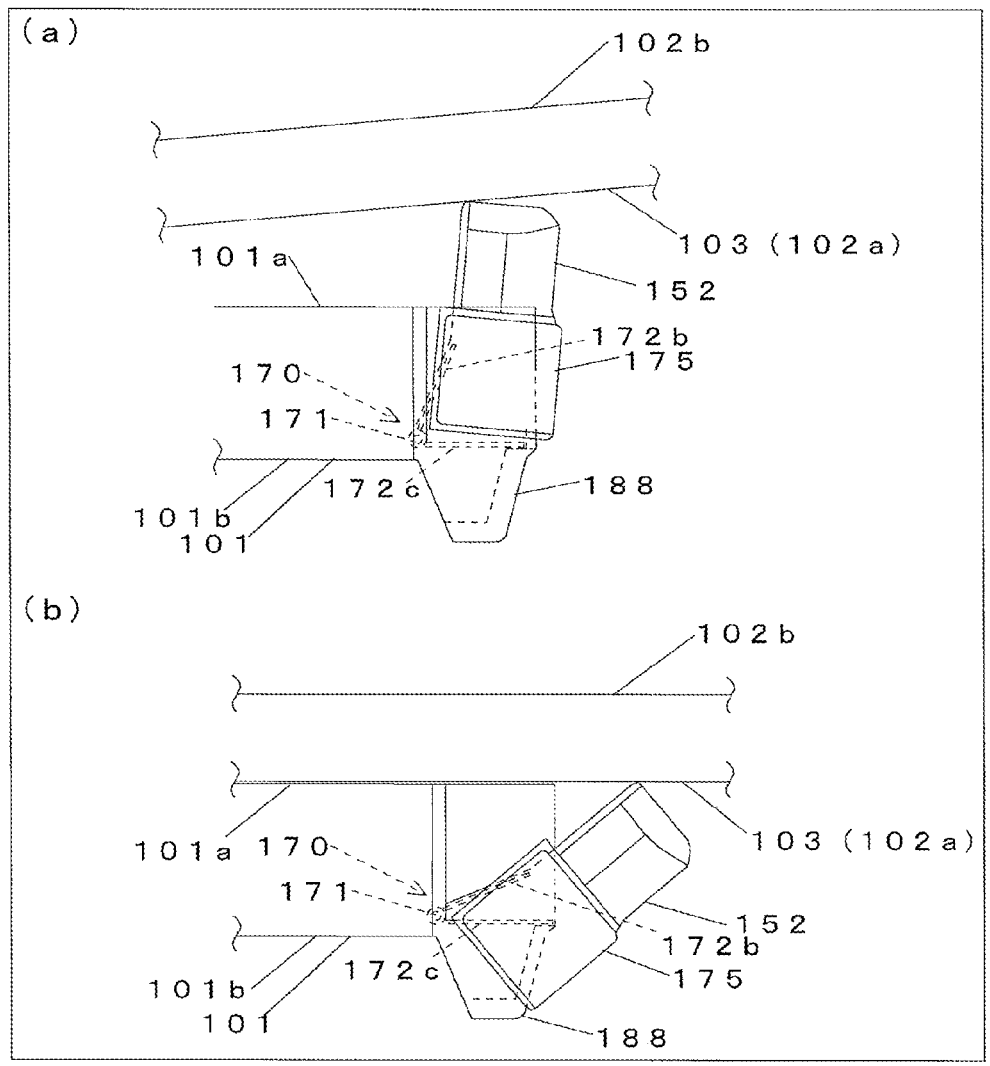
FIG. 8 illustrates a state where the second support component of the electronic device according to the first embodiment is titled, as viewed from the rear side of the first casing.

FIG. 7 illustrates the second support component 152 of the electronic device 100 of the present embodiment, as viewed from the rear side of the first casing 101. FIG. 8 illustrates a state where the second support component 152 of the electronic device 100 according to the present embodiment is tilted, as viewed from the rear side of the first casing 101.

As shown in FIG. 5(c), the movable support section 170 includes: a support axial-component 171 for rotating the second support component 152 relative to the first casing 101; an axial-component receiving section 174 for supporting the support axial-component 171 provided in the first casing 101, so as to allow the support axial-component 171 to rotate; and an elastic component 172 for restoring a position of the second support component 152 which has been pushed by the display 103 and pivoted about the support axial-component 171.

The support axial-component 171 is formed in a circular cylindrical shape. The support axial-component 171 extends in the front-rear direction of the first casing 101. As shown in FIG. 7, a pivot of the support axial-component 171 is positioned, in the first casing 101, inward of a position in the second support component 152 at which the second support component 152 abuts against the display 103, in the left-right direction of the first casing 101. Further, the pivot of the support axial-component 171 is below a lower end of a corner component 175 described below, in the up-down direction of the first casing 101.

On the other hand, the elastic component 172 is implemented as a torsion spring. The elastic component 172 includes: a coil section 172a, formed as a coil-like component, through which the support axial-component 171 penetrates; a first rod section 172b that extends from one end of the coil section 172a in almost a tangential direction; and a second rod section 172c that extends from the other end of the coil section 172a in almost a tangential direction, as shown in FIG. 5(c). In the elastic component 172 in the state shown in FIG. 7 (a state where the second support component 152 is not tilted), in a state where the coil section 172a is supported by the support axial-component 171, the first rod section 172b is pushed by a connection component 176 described below, and the second rod section 172c is pushed by a bottom surface of a fitting groove 188a of a leg section 188.

The second support component 152 forms a part of the movable component 181 that is supported so as to be movable relative to the first casing 101. The movable component 181 is supported so as to be movable relative to the first casing 101 through a fixed component 182 fixed to the first casing 101.

As shown in FIG. 7, the movable component 181 is a component in which the second support component 152, the corner component 175 provided below the second support component 152, and the connection component 176 for connecting to the fixed component 182 are integrated with each other. The corner component 175 is integrated with the lower end of the second support component 152. Further, the connection component 176 is integrated with an inner surface of the corner component 175. The connection component 176 extends diagonally downward from the inner surface of the corner component 175. The first rod section 172b of the elastic component 172 is fixed to an inner surface of the connection component 176. A through hole 176a into which the support axial-component 171 is inserted is formed at an end portion of the connection component 176, as shown in FIG. 5(c). Both ends of the support axial-component 171 which is inserted into the through hole 176a are fitted into the axial-component receiving section 174 of the fixed component 182, thereby connecting the movable component 181 to the fixed component 182.

On the other hand, the fixed component 182 includes: a body section 187 which is roughly L-shaped as viewed in a planar manner: and the leg section 188 integrated with a lower portion of the body section 187. As shown in FIG. 5(b), a cut portion 185 is formed at a corner portion (the left far side corner portion in FIG. 1), on the far side, of the first casing 101. The fixed component 182 is fixed to the first casing 101 by means of screws and the like in a state where the body section 187 is fitted into the cut portion 185. In this state, a cut portion 186 into which the movable component 181 is fitted is formed outside the body section 187 which is almost L-shaped as viewed in a planar manner.

As shown in FIG. 5(c), the body section 187 has formed therein the axial-component receiving section 174 for supporting the support axial-component 171 so as to allow the support axial-component 171 to rotate. The axial-component receiving section 174 includes: a first axial-component receiving section 174a formed in an inner surface of a portion, in the body section 187, forming a part of the rear side end face 101d of the first casing 101; and a second-axial-component receiving section 174b opposed to the first axial-component receiving section 174a. The first axial-component receiving section 174a and the second axial-component receiving section 174b are opposed to each other in the front-rear direction of the first casing 101.

The leg section 188 projects from the back surface 101b of the electronic device 100 as shown in FIG. 5(c). On the upper end in the inner surface of the leg section 188, the fitting groove 188a into which the second rod section 172c of the elastic component 172 is fitted, is formed. The second rod section 172c is supported by the bottom surface of the fitting groove 188a. On the far side of the first casing 101, the leg section 188 is also provided at a position opposite to the first support component 151 on the side reverse of the first support component 151 side (the right far side corner portion in FIG. 1) (not shown).

[1-5. Function, Effect, and the Like of Movable Support Section]

In the movable support section 170, the support axial-component 171 is provided along the front-rear direction of the first casing 101. The support axial-component 171 is supported by a pair of the first axial-component receiving section 174a and the second axial-component receiving section 174b, so as to be rotatable. In this state, in a case where the electronic device 100 is closed in the course of switching between the normally opened position and the inversely opened position as shown in FIG. 2, the display 103 on the front surface 102a of the second casing 102 abuts against the top end of the second support component 152. When the second support component 152 is pushed downward by the display 103, the second support component 152 pivots about the support axial-component 171 to rotate outward of the first casing 101, and the second support component 152 is tilted outward of the first casing 101, as shown in FIG. 8(a).

When the second casing 102 is further tilted from the position shown in FIG. 8(a) so as to approach the first casing 101, the second support component 152 is further pushed, and the second support component 152 is further rotated by pivoting about the support axial-component 171. The second support component 152 can pivot about the support axial-component 171 to rotate to a limit position at which the lower end of the corner component 175 abuts against the outer surface of the leg component 188, as shown in FIG. 8(b). The top end portion of the second support component 152 having been rotated to the limit position is almost level with the top surface 101a of the first casing 101. In the present embodiment, an amount of projection of the second support component 152 continues to be successively reduced until the front surface 102a of the second casing 102 abuts against the top surface 101a of the first casing 101.

According to the present embodiment, even if the second support component 152 abuts against the display 103 in a case where the electronic device 100 is closed in the course of switching between the normally opened position and the inversely opened position, an amount of projection of the second support component 152 is reduced. Therefore, an external force applied from the second support component 152 to the display 103 can be reduced.

In a case where, as in the present embodiment, a direction in which the second casing 102 rotates relative to the first casing 101 is uniquely set, a portion against which the display 103 is likely to abut in the course of switching between the normally opened position and the inversely opened position, is limited. In such a case, even in a case where components that project from the top surface 101a of the first casing 101 function in conjunction with each other, only the component against which the display 103 is likely to abut may be movable so as to reduce an amount of projection. Specifically, in the present embodiment, although the display 103 is likely to abut against the second support component 152 in the course of switching between the normally opened position and the inversely opened position, the display 103 may not abut against the first support component 151. This is because the first auxiliary axial-component 141 is restrained from moving in the far side direction, by means of the wall surface of the recess 156. Therefore, in the present embodiment, the first support component 151 is fixed to the first casing 101 so as not to be movable. Also in this case, when the display 103 faces the far side, the back surface 102b of the display 103 may abut against the first support component 151 by the display 103 being titled toward the near side. However, in general, the display 103 is more fragile than the back surface 102b, and it is significant to protect the display 103 as an electronic component. On the other hand, the back surface 102b is likely to be hard and resistant to the abutment of the first support component 151.

Further, the second support component 152 rotates outward of the first casing 101 by pivoting about the support axial-component 171. The pivot of the support axial-component 171 is positioned, in the first casing 101, inward of a position in the second support component 152 at which the second support component 152 abuts against the display 103. Therefore, the second support component 152 can be smoothly rotated outward of the first casing 101 due to a load applied from the display 103 to the second support component 152.

Further, when the display 103 is moved away from the second support component 152, the second support component 152 is returned, due to a restoring force of the elastic component 172, to a non-pushed position in which the second support component 152 is not pushed by the display 103. Therefore, a user is allowed to omit an operation for returning the second support component 152 to the non-pushed position.

[1-6. Summary of the First Embodiment]

In the present embodiment, the support assisting section 150 for assisting the hinge mechanism 120 in supporting the second casing 102 includes: the first auxiliary axial-component 141 (axial-component) that is provided in one of the first casing 101 and the second casing 102, and is positioned on an extended line of the opening and closing axial-components 126 and 127 in the normally opened position; and the first support component 151 (axial-component receiving section) that is provided in the other of the first casing 101 and the second casing 102, has formed therein the recess 156 into which the first auxiliary axial-component 141 fits in the normally opened position, and supports the first auxiliary axial-component 141 on the wall surfaces 156a and 156b of the recess 156. In the first support component 151, the recess 156 is open on at least one of the front side and the rear side. The second casing 102 is rotated about the inverting axial-component 128 relative to the first casing 101, to move the first auxiliary axial-component 141 into or out of the recess 156 through the side on which the recess 156 is open. According to the present embodiment, the first auxiliary axial-component 141 can be moved into or out of the recess 156 through the side on which the recess 156 is open, without moving the first auxiliary axial-component 141 in the axial direction. Therefore, the structure of the support assisting section 150 can be simplified, and the second casing 102 can be stably supported by the support assisting section 150 in the normally opened position.

Further, in the present embodiment, the second support component 152 is further provided which has formed therein the recess 166 into which the first auxiliary axial-component 141 fits in the inversely opened position, and supports the first auxiliary axial-component 141 on the wall surfaces 166a and 166b of the recess 166. The recess 166 of the second support component 152 is open on the same side as the side on which the recess 156 of the first support component 151 is open, among the front side and the rear side of the recess 166. The first auxiliary axial-component 141 having been moved out of the recess 156 of the first support component 151 is moved into the recess 166 of the second support component 152 through the side on which the recess 166 is open, when the normally opened position is switched to the inversely opened position. Therefore, also in the inversely opened position, the second casing 102 can be stably supported by the support assisting section 150 having a simplified structure.

Further, in the present embodiment, in the first casing 101 and the second casing 102, the second auxiliary axial-component 142 (projecting component) is further provided which projects from the second casing 102 (casing having an axial-component provided therein) having the first auxiliary axial-component 141 provided therein, fits into the recess 166 of the second support component 152 in the normally opened position, and fits into the recess 156 of the first support component 151 in the inversely opened position. In the normally opened position and the inversely opened position, the second casing 102 is supported by not only the first auxiliary axial-component 141 but also the second auxiliary axial-component 142. Therefore, the second casing 102 can be supported with enhanced stability.

Moreover, in the present embodiment, the elastic component 165 is further provided for changing an amount of projection of the second auxiliary axial-component 142 from the second casing 102. In the first support component 151 and the second support component 152, the recesses 156 and 166, respectively, are each open on one of the front side and the rear side, and have the axial-component stop walls 156c and 166c, respectively, formed on the other of the front side and the rear side for preventing passing of the first auxiliary axial-component 141. When switching between the normally opened position and the inversely opened position is performed, the first auxiliary axial-component 141 passes through the sides on which the recesses 156 and 166 are open, and the second auxiliary axial-component 142 is pushed by the axial-component stop walls 156c and 166c to contract the elastic component 165, so that an amount of projection of the second auxiliary axial-component 142 is reduced, thereby allowing the second auxiliary axial-component 142 to pass by the axial-component stop walls 156c and 166c. In the present embodiment, an amount of projection of the second auxiliary axial-component 142 is changed by means of the elastic component 165. Therefore, the second auxiliary axial-component 142 can be smoothly moved into or out of the recesses 156 and 166 regardless of the support components 151 and 152 having provided therein the axial-component stop walls 156c and 166c, respectively, for preventing passing of the first auxiliary axial-component 141.

Further, in the present embodiment, the first auxiliary axial-component 141 is fixed to the second casing 102. Therefore, an amount of projection of the first auxiliary axial-component 141 is constant. Accordingly, in the normally opened position, the first auxiliary axial-component 141 can be supported by the first support component 151 with enhanced stability. In the inversely opened position, the first auxiliary axial-component 141 can be supported by the second support component 152 with enhanced stability.

Furthermore, according to the present embodiment, in the first support component 151, the axial-component stop wall 156c is lower than each of the axial-component support walls 156a and 156b which are paired, which extend from both ends, respectively, of the axial-component stop wall 156c in the front-rear direction, and which support the first auxiliary axial-component 141 in the normally opened position. Therefore, the second auxiliary axial-component 142 can be smoothly moved into or out of the recess 156 of the first support component 151.

Further, in the present embodiment, the height of the axial-component stop wall 156c of the first support component 151 is lower than the height of the axial-component stop wall 166c of the second support component 152. A user can feel that an amount of projection of the second auxiliary axial-component 142 is restored when the second auxiliary axial-component 142 fits into the recess 156 or 166. The user can recognize that the switching between the normally opened position and the inversely opened position has been ended. In the present embodiment, the height of the axial-component stop wall 156*c* of the first support component 151 is lower than the height of the axial-component stop wall 166*c* of the second support component 152. Therefore, a user can experience a feeling different between the switching to the normally opened position and the switching to the inversely opened position.

Furthermore, in the present embodiment, the top portion 142*a* of the second auxiliary axial-component 142 is rounded, and the top portion 142*a* abuts against the axial-component stop walls 156*c* and 166*c* when switching between the normally opened position and the inversely opened position is performed. Therefore, the second auxiliary axial-component 142 can be smoothly moved into or out of the recesses 156 and 166.

Moreover, in the present embodiment, the first auxiliary axial-component 141 is formed in a roughly circular-cylindrical shape. Therefore, when the electronic device 100 is opened and closed, a friction between the first auxiliary axial-component 141 and each of the wall surfaces of the recesses 156 and 166 is relatively small. Therefore, the second casing 102 can be stably supported without preventing opening and closing of the electronic device 100.

Further, in the present embodiment, the hinge mechanism 120 is structured such that the second casing 102 is allowed to rotate about the inverting axial-component 128 relative to the first casing 101 only in the first rotation direction when the normally opened position is switched to the inversely opened position, and the second casing 102 is allowed to rotate about the inverting axial-component 128 relative to the first casing 101 only in the second rotation direction opposite to the first rotation direction when the inversely opened position is switched to the normally opened position. In the first support component 151, the recess 156 is open on a side, among the front side and the rear side, through which the first auxiliary axial-component 141 is allowed to pass in a case where the second casing 102 is rotated in the direction in which the rotation is allowed in the course of switching between the normally opened position and the inversely opened position. The support components 151 and 152 have the axial-component stop walls 156*c* and 166*c*, respectively, formed on a side opposite to the open side, among the front side and the rear side of each of the recesses 156 and 166. Therefore, the second casing 102 can be prevented from rotating beyond a rotation range of the second casing 102 which is set in the hinge mechanism 120.

Further, in the present embodiment, the first auxiliary axial-component 141 is provided in the second casing 102. The first support component 151 and the second support component 152 are provided in the first casing 101 so as to project from the top surface 101*a* of the first casing 101. The hinge mechanism 120 is structured such that the second casing 102 is allowed to rotate about the inverting axial-component 128 relative to the first casing 101 only in the first rotation direction when the normally opened position is switched to the inversely opened position, and the second casing 102 is allowed to rotate about the inverting axial-component 128 relative to the first casing 101 only in the second rotation direction opposite to the first rotation direction when the inversely opened position is switched to the normally opened position. The second support component 152 is positioned at such a position as to abut against the display 103 in a case where the electronic device 100 is closed in the course of switching between the normally opened position and the inversely opened position, and is supported so as to be movable relative to the first casing 101 when the second support component 152 is pushed by the display 103 due to the abutment such that an amount of projection of the second support component 152 from the top surface 101*a* of the first casing 101 is reduced. In the present embodiment, according to the display 103 being tilted after the display 103 abuts against the second support component 152, an amount of projection of the second support component 152 is reduced. Therefore, an external force applied from the second support component 152 to the display 103 can be reduced as compared to a case where an amount of projection of the second support component 152 is not changed.

Further, in the present embodiment, the first support component 151 is fixed in the first casing 101 on a side opposite to the second support component 152 side so as to sandwich the hinge mechanism 120. In the present embodiment, the display 103 does not face the first support component 151 in the course of switching between the normally opened position and the inversely opened position, and the first support component 151 that does not abut against the display 103 is fixed to the first casing 101. Therefore, the first auxiliary axial-component 141 can be stably supported by the first support component 151 in the normally opened position.

Further, according to the present embodiment, in the first support component 151, the recess 156 is open on only one of the front side or the rear side. The first support component 151 includes the stopper 157 that switches between the projecting state in which the stopper 157 projects from the bottom surface of the recess 156 to prevent the first auxiliary axial-component 141 from passing through the side on which the recess 156 is open, and the non-projecting state in which the stopper 157 does not project from the bottom surface of the recess 156. When the stopper 157 is put into the projecting state in the normally opened position, rotation of the second casing 102 about the inverting axial-component 128 can be inhibited. Therefore, the second casing 102 can be supported with enhanced stability when the normally opened position is switched to the normally closed position. Further, in the normally opened position, rotation of the second casing 102 against a user's intention can be prevented.

Further, in the present embodiment, the recess 156 is roughly U-shaped. Therefore, the first auxiliary axial-component 141 can be smoothly introduced into the recess 156.

Second Embodiment

Hereinafter, a second embodiment will be described with reference to FIG. 9 and FIG. 10. The second embodiment is different from the first embodiment in shape of the recess 156 of the first support component 151 and shape of the recess 166 of the second support component 152. In the second embodiment, the shape of the recess 156 of the first support component 151 and the shape of the recess 166 of the second support component 152 are the same. Hereinafter, the recess 156 of the first support component 151 will be described. Similarly to the first embodiment, the first support component 151 is fixed to the first casing 101, and the second support component 152 is supported so as to be movable relative to the first casing 101, by the movable support section 170.

Further, the second embodiment is different from the first embodiment in shape of a fitting section 240 of the first auxiliary axial-component 141 which fits into the recesses 156 and 166 and shape of a fitting section of the second auxiliary axial-component 142 which fits into the recesses 156 and 166. In the second embodiment, the shape of the fitting section 240 of the first auxiliary axial-component 141 and the shape of the fitting section of the second auxiliary axial-component 142 are the same. Hereinafter, the shape of the fitting section 240 of the first auxiliary axial-component 141 will be described.

Figure 9:
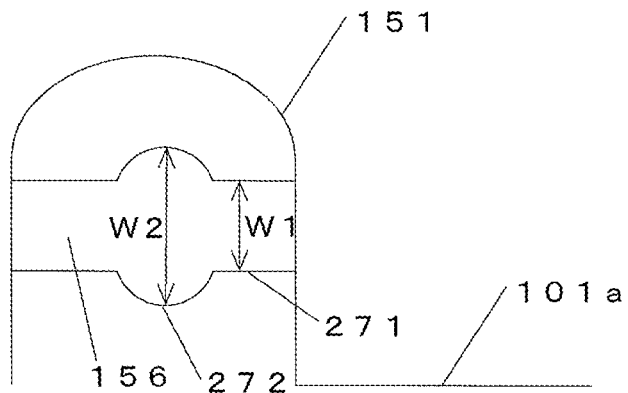
FIG. 9 is a front view of an inner surface of a first support component of the electronic device according to a second embodiment.
Figure 10:
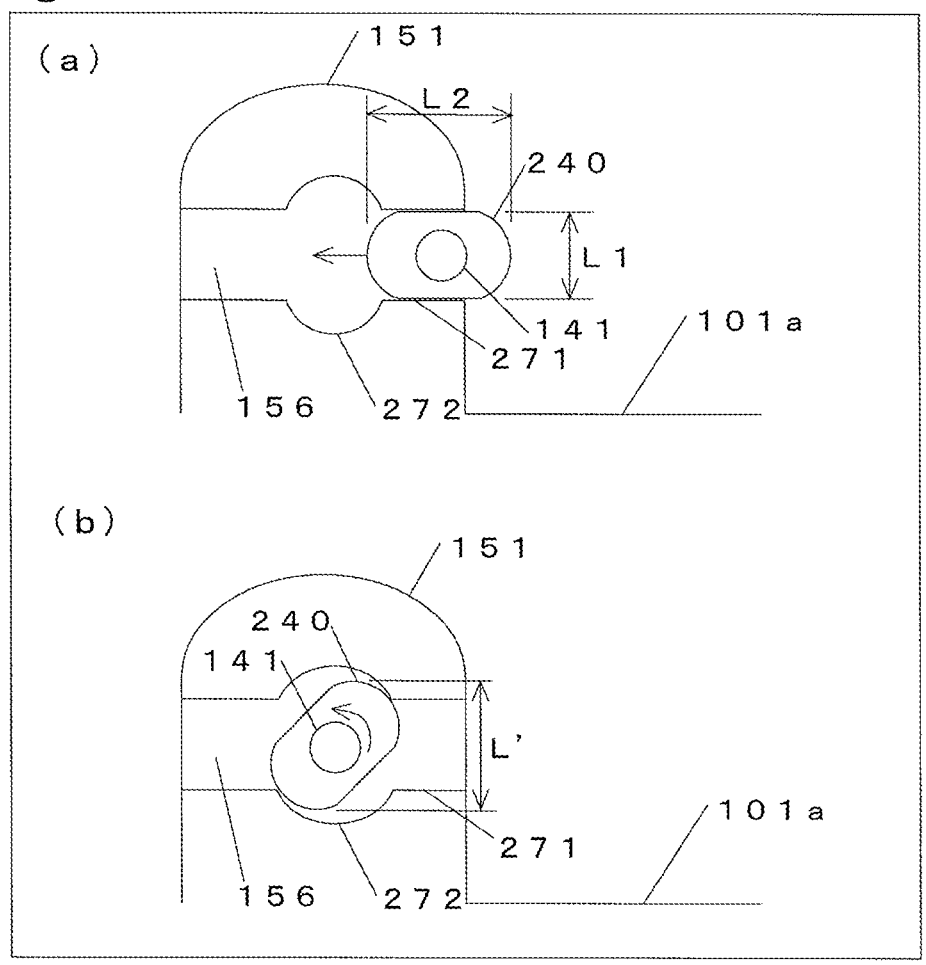
FIG. 10 illustrates a state where a first auxiliary axial-component is moved into or out of the first support component of the electronic device according to the second embodiment.

FIG. 9 is a front view of an inner surface of the first support component 151 of the electronic device according to the present embodiment. FIG. 10 illustrates a state where the first auxiliary axial-component 141 is moved into or out of the first support component 151 of the electronic device 100 according to the present embodiment.

As shown in FIG. 9, the recess 156 of the first support component 151 is formed as a groove that extends in the front-rear direction from an inlet/outlet through which the first auxiliary axial-component 141 is moved into or out of the recess 156. The first support component 151 has formed therein a reduced-width section 271 in which the recess 156 has a narrow groove width, and an increased-width section 272 that is positioned in the recess 156 inward of the reduced-width section 271 and that has a groove width of the recess 156 increased as compared to the reduced-width section 271. The increased-width section 272 is formed by side walls of the recess 156 being each cut at almost the center portion thereof so as to be roughly D-shaped. In the first support component 151, the recess 156 is open on both the front side and the rear side thereof. As shown in FIG. 10(a), the fitting section 240 of the first auxiliary axial-component 141 which fits into the recess 156 has a cross-sectional shape of which the length in the width direction of the recess 156 is changed when the first auxiliary axial-component 141 is rotated about its axial center. Specifically, the fitting section 240 has a roughly elliptical cross-sectional shape. In the fitting section 240, a length L1, in a first direction, which passes through the axial center of the first auxiliary axial-component 141 is smaller than a groove width W1 of the reduced-width section 271, and a length L2, in a second direction orthogonal to the first direction, which passes through the axial center of the first auxiliary axial-component 141 is greater than the groove width W1 of the reduced-width section 271, and is smaller than a groove width W2 of the increased-width section 272.

As shown in FIG. 10(a), when the first auxiliary axial-component 141 is moved into or out of the recess 156, an orientation of the fitting section 240 is set such that the second direction of the fitting section 240 is the same as a direction (the front-rear direction of the first casing 101) in which the recess 156 extends. As a result, the fitting section 240 is put into a passing-allowed state in which the length L1 in the width direction of the recess 156 is smaller than the groove width W1 of the reduced-width section 271, and the fitting section 240 passes through the reduced-width section 271 of the recess 156. As shown in FIG. 10(b), when the second casing 102 pivots about the opening and closing axial-components 126 and 127 in a state where the fitting section 240 is positioned in the increased-width section 272 of the recess 156, the first auxiliary axial-component 141 is rotated to rotate the fitting section 240 in the increased-width section 272. As a result, the fitting section 240 is put into a passing-unallowed state in which a length L' in the width direction of the recess 156 is greater than the groove width W1 of the reduced-width section 271, and is smaller than the groove width W2 of the increased-width section 272. Thus, the fitting section 240 is held in the increased-width section 272.

In the present embodiment, a structure of the support assisting section 150 for assisting the hinge mechanism 120 in supporting the second casing 102 can be simplified. Further, since the fitting section 240 is held in the increased-width section 272 of the recess 156, the first auxiliary axial-component 141 can be stably held.

Although, in the present embodiment, the first auxiliary axial-component 141 rotates in conjunction with the second casing 102 pivoting about the opening and closing axial-components 126 and 127, a mechanism may be provided for automatically rotating the first auxiliary axial-component 141 when the first auxiliary axial-component 141 reaches the increased-width section 272.

[Summary of the Second Embodiment]

In the present embodiment, the recesses 156 and 166 are each formed as a groove that extends in the front-rear direction from an inlet/outlet through which the first auxiliary axial-component 141 is moved into or out of the recesses 156 and 166. The first support component 151 and the second support component 152 each have formed therein the reduced-width section 271 in which the recesses 156 and 166 each have a narrow groove width, and the increased-width section 272 that is positioned in the recesses 156 and 166 inward of the reduced-width section 271, and has a groove width of the recesses 156 and 166 increased as compared to the reduced-width section 271. The fitting section 240 of the first auxiliary axial-component 141 which fits into the recesses 156 and 166 has a cross-sectional shape that switches between the passing allowed state in which the length in the width direction of each of the recesses 156 and 166 is smaller than the groove width of the reduced-width section 271, and the passing unallowed state in which the length in the width direction of each of the recesses 156 and 166 is greater than the groove width of the reduced-width section 271, and smaller than the groove width of the increased-width section 272, due to the rotation of the first auxiliary axial-component 141. In the passing allowed state in which the length in the width direction of each of the recesses 156 and 166 is smaller than the groove width of the reduced-width section 271, the first auxiliary axial-component 141 can be moved into or out of the recesses 156 and 166 through the sides on which the recesses 156 and 166 are open, without moving the first auxiliary axial-component 141 in the axial direction. Therefore, the structure of the support assisting section 150 can be simplified, and the second casing 102 can be stably supported by the support assisting section 150 in the normally opened position. Further, in the passing unallowed state in which the length in the width direction of each of the recesses 156 and 166 is greater than the groove width of the reduced-width section 271 and is smaller than the groove width of the increased-width section 272, disengagement of the first auxiliary axial-component 141 from the recesses 156 and 166 against a user's intention can be prevented.

Other Embodiments

As described above, the first and the second embodiments have been descried above as examples of the technology disclosed in the present application. However, the technology according to the present disclosure is not limited to these embodiments, and is also applicable to other embodiments realized by modifications, replacements, additions, and omissions as appropriate. Furthermore, another embodiment can be realized by combining the components described in the first and the second embodiments.

Hereinafter, other exemplary embodiments will be described.

In the first and the second embodiments, a notebook computer is described as an example of the electronic device 100. However, the electronic device 100 may be, for example, foldable mobile telephone terminals, foldable electronic game machines, and foldable electronic dictionary terminals. The electronic device may be a device that includes the hinge mechanism 120 having the opening and closing axial-component and the inverting axial-component.

Further, although, in the first and the second embodiments, the movable support section 170 supports the second support component 152 so as to allow the second support component 152 to rotate outward of the first casing 101, the second support component 152 may be supported so as to be movable in the thickness direction of the first casing 101.

Furthermore, although, in the first and the second embodiments, the movable support section 170 includes the elastic component 172 for restoring a position of the second support component 152 which has been pushed by the display 103 and moved, the movable support section 170 may not include the elastic component 172. When the movable support section 170 does not include the elastic component 172, a position of the second support component 152 which has been pushed by the display 103 and moved is restored by a user.

Further, although, in the first and the second embodiments, the second support component 152 is supported by the movable support section 170 so as to be movable, another projecting component positioned at such a position as to abut against the display 103 in a case where the electronic device 100 is closed, may be supported so as to be movable such that an amount of projection of the projecting component from the top surface 101a of the first casing 101 is reduced when the projecting component is pushed by the display 103. Such a projecting component may be a component (for example, a track pointer used for moving a pointer (for example, an arrow) on a screen) that projects in a region, on the top surface 101a of the first casing 101, in which a keyboard is provided. In this case, the hinge mechanism 120 may be structured such that the second casing 102 cannot rotate relative to the first casing 101 in a state where the electronic device 100 is opened. Further, in a case where the second casing 102 can be rotated, in the normally opened position, counterclockwise as viewed from above the electronic device 100, the first support component 151 may be supported, as such a projecting component, so as to be movable.

Further, although, in the first and the second embodiments, the first support component 151 and the second support component 152 are provided in the first casing 101 and the first auxiliary axial-component 141 and the second auxiliary axial-component 142 are provided in the second casing 102, the first support component 151 and the second support component 152 may be provided in the second casing 102 and the first auxiliary axial-component 141 and the second auxiliary axial-component 142 may be provided in the first casing 101. In this case, for example, the first auxiliary axial-component 141 or the second auxiliary axial-component 142 projects toward the inner side from an inner surface of a projecting component that projects from the corner portion, on the far side, of the first casing 101. On the outer side surfaces 121a and 122a of the projecting case components 121 and 122 of the second casing, recesses into which the first auxiliary axial-component 141 and the second auxiliary axial-component 142, respectively, fit are formed.

Further, in the first and the second embodiments, the support assisting section 150 has provided therein the first auxiliary axial-component 141, the second auxiliary axial-component 142, the first support component 151, and the second support component 152. However, the support assisting section 150 may not have provided therein the second auxiliary axial-component 142 and the second support component 152. The support assisting section 150 may have provided therein at least the first auxiliary axial-component 141 and the first support component 151, and additionally have the second support component 152 provided therein.

Furthermore, although, in the first and the second embodiments, the recesses 156 and 166 in the first support component 151 and the second support component 152, respectively, are each open only on the front side, each of the recesses 156 and 166 may be open on both the front side and the rear side. In this case, the second auxiliary axial-component 142 may be formed so as to have a flat top surface and a roughly circular-cylindrical shape, and may be fixed to the second projecting case component 122, similarly to the first auxiliary axial-component 141.

Further, although, in the first and the second embodiments, the first auxiliary axial-component 141 is formed in almost a circular cylindrical shape, the first auxiliary axial-component 141 may be formed in another shape (for example, a polygonal column).

Furthermore, in the first and the second embodiments, the second auxiliary axial-component 142 may function as an axial-component, and may be formed in a shape (for example, a spherical shape) other than a column-like shape.

As presented above, the embodiments have been described as an example of the technology according to the present disclosure. For this purpose, the accompanying drawings and the detailed description are provided.

Therefore, components in the accompanying drawings and the detailed description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiments have been described to exemplify the technology according to the present disclosure, and therefore, various modifications, replacements, additions, and omissions may be made within the scope of the claims and the scope of the equivalents thereof.

What is claimed is:

1. An electronic device, comprising:
a first casing;
a second casing having a display;
a hinge mechanism having:
an opening and closing axial-component that is used when the electronic device is opened and closed by the opening and closing axial-component pivoting about a rear side portion of the first casing, and
an inverting axial-component used when the second casing is rotated relative to the first casing with the electronic device being opened, to switch between a normally opened position in which the display faces the first casing side and an inversely opened position in which the display faces a side opposite to the side which the display faces in the normally opened position;
an axial-component that is provided in one of the first casing and the second casing, and is positioned on an extended line of the opening and closing axial-component in the normally opened position;
a first axial-component receiving section that is provided in the other of the first casing and the second casing, has formed therein a first recess into which the axial-component fits in the normally opened position, and supports the axial-component on a wall surface of the first recess;

a second axial-component receiving section that is provided in the other of the first casing and the second casing, has formed therein a second recess into which the axial-component fits in the inversely opened position, and supports the axial-component on a wall surface of the second recess, wherein:

the first recess is open on at least one of a front side and a rear side in the axial-component receiving section, and the second casing is rotated about the inverting axial-component relative to the first casing, and the axial-component is moved into or out of the recess through the side on which the first recess is open, the second recess is open only on the same side as a side on which the first recess of is open, among a front side and a rear side of the second recess, and the second casing is rotated about the inverting axial-component relative to the first casing, and the axial-component is moved into or out of the first recess through the side on which the recess is open, and in each of the first axial-component receiving section and the second axial-component receiving section, the other of the front side and the rear side of the first recess forms an axial-component stop wall that prevents passing of the axial-component;

a projecting component that projects from a casing with the axial-component, among the first casing and the second casing, having the axial-component provided therein, that fits into the second recess in the normally opened position, and that fits into the first recess in the inversely opened position; and an elastic component used for changing an amount of projection of the projecting component from the casing with the axial-component, wherein the axial-component passes on the side on which the recess is open, and the projecting component is pushed by the axial-component stop wall according to a rotation of the second casing to contact the elastic component, and an amount of projection of the projecting component is thus reduced to allow the projecting component to pass by the axial-component stop wall, in the course of switching between the normally opened position and the inversely opened position.

2. The electronic device according to claim 1, wherein the axial-component is fixed to the casing with the axial-component.

3. The electronic device according to claim 1, wherein, in the first axial-component receiving section, the axial-component stop wall is lower than paired axial-component support walls that extend from both ends, respectively, of the axial-component stop wall in a front-rear direction and support the axial-component in the normally opened position.

4. The electronic device according to claim 1, wherein a height of the axial-component stop wall of the first axial-component receiving section is lower than a height of the axial-component stop wall of the second axial-component receiving section.

5. The electronic device according to claim 1, wherein a top end of the projecting component is rounded, and the top end abuts against the axial-component stop wall in the course of switching between the normally opened position and the inversely opened position.

6. The electronic device according to claim 5, wherein the axial-component is formed in a roughly circular-cylindrical shape.

7. The electronic device according to claim 1, wherein the hinge mechanism is structured such that the second casing is allowed to rotate about the inverting axial-component relative to the first casing only in a first rotation direction in the course of the normally opened position being switched to the inversely opened position, and the second casing is allowed to rotate about the inverting axial-component relative to the first casing only in a second rotation direction opposite to the first rotation direction in the course of the inversely opened position being switched to the normally opened position, and in the axial-component receiving section, the recess is open on a side, among the front side and the rear side, through which the axial-component passes in a case where the second-casing is rotated in the direction in which the rotation is allowed, in the course of switching between the normally opened position and the inversely opened position.

8. The electronic device according to claim 1, wherein the axial-component is provided in the second casing, the first axial-component receiving section and the second axial-component receiving section are provided in the first casing so as to project from a top surface of the first casing, the hinge mechanism is structured such that the second casing is allowed to rotate about the inverting axial-component relative to the first casing only in a first rotation direction in the course of the normally opened position being switched to the inversely opened position, and the second casing is allowed to rotate about the inverting axial-component relative to the first casing only in a second rotation direction opposite to the first rotation direction in the course of the inversely opened position being switched to the normally opened position, the second axial-component receiving section is positioned at such a position as to abut against the display when the electronic device is closed in the course of switching between the normally opened position and the inversely opened position, and is supported so as to be movable relative to the first casing when the second axial-component receiving section is pushed by the display due to the abutment such that an amount of projection of the second axial-component receiving section from the top surface of the first casing is reduced.

9. The electronic device according to claim 8, wherein the first axial-component receiving section is fixed in the first casing on a side opposite to the second axial-component receiving section side so as to sandwich the hinge mechanism.

10. The electronic device according to claim 1, wherein the first recess is open on one of the front side and the rear side in the first axial-component receiving section, the axial-component receiving section has provided therein a stopper that switches between a projecting state in which the stopper projects from a bottom surface of the first recess to prevent the axial-component from passing through the side on which the recess is open, and a non-projecting state in which the stopper does not project from the bottom surface of the first recess.

11. The electronic device according to claim 1, wherein the first and second recesses are roughly U-shaped.

12. The electronic device according to claim 1, wherein the first recess is formed as a groove that extends in a front-rear direction from an outlet/inlet through which the axial-component is moved into or out of the recess, the first axial-component receiving section has formed therein a reduced-width section in which the first recess has a narrow groove width, and an increased-width section that is positioned in the recess inward of the reduced-width section, and has a groove width of the recess which is greater than the groove width of the reduced-width section, and a fitting section of the axial-component which fits into the first recess has a cross-sectional shape that switches between a passing allowed state in which a length in a width direction of the first recess is smaller than the groove width of the reduced-width section, and a passing unallowed state in which the length in the width direction of the first recess is greater than the groove width of the reduced-width section, and is smaller than the groove width of the increased-width section, due to rotation of the axial-component.

* * * * *